(12) United States Patent
Okitaka

(10) Patent No.: US 6,380,567 B1
(45) Date of Patent: Apr. 30, 2002

(54) SEMICONDUCTOR DEVICE AND FABRICATION METHOD THEREOF

(75) Inventor: Takenori Okitaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/099,327

(22) Filed: Jun. 18, 1998

(30) Foreign Application Priority Data

Feb. 2, 1998 (JP) .......................................... 10-021177

(51) Int. Cl.[7] .............................................. H01L 27/10
(52) U.S. Cl. ...................... 257/211; 257/659; 257/758; 438/622
(58) Field of Search .............................. 257/211, 659, 257/758; 438/622

(56) References Cited

U.S. PATENT DOCUMENTS 6,166,403 A * 12/2000 Castagnetti et al. ........ 257/211

FOREIGN PATENT DOCUMENTS

| JP | 60-224244 | 11/1985 |
|----|-----------|---------|
| JP | 63-244877 | 10/1988 |
| JP | 1-164048  | 6/1989  |
| JP | 3-263355  | 11/1991 |
| JP | 4-69950   | 3/1992  |

* cited by examiner

*Primary Examiner*—Mark V. Prenty
(74) *Attorney, Agent, or Firm*—Burns, Doane, Swecker & Mathis, LLP

(57) ABSTRACT

A shield interconnection layer 8 is disposed on a third insulating film 6c in such a manner as to cover the entire surface of a region in which a functional cell 3 is formed. The shield interconnection layer 8 is connected through a second through-hole 10 to an interconnection layer having a specific potential such as a power supply interconnection layer or a ground interconnection layer in a region different from the region in which the functional cell 3 is formed.

7 Claims, 5 Drawing Sheets

SEMICONDUCTOR DEVICE AND FABRICATION METHOD THEREOF

BACKGROUND OF THE INVENTION

1. Field of the Invention

The present invention relates to a semiconductor device including a shield interconnection layer on the upper side from the uppermost one of in-cell interconnection layers provided in a functional cell formed on a semiconductor substrate, and a method of fabricating the semiconductor substrate.

2. Description of the Prior Art

FIG. 6 is a plan view schematically showing a configuration of a semiconductor device according to a first prior art example. FIG. 7 is a sectional view taken on line VII—VII in FIG. 6. In FIGS. 6 and 7, reference numeral 101 denotes a semiconductor device; 102 denotes a semiconductor substrate; 103 denotes a functional cell, formed on the semiconductor substrate 102, in which a DRAM, an analog circuit and the like are formed; and 104 denotes a between-cell interconnection layer for connecting the function cell 103 to another functional cell 103 (not shown).

In the functional cell 103, reference numeral 105 denotes each of in-cell interconnection layers provided in the functional cell 103; 106a denotes a first insulating film formed between the semiconductor substrate 102 and the lowermost in-cell interconnection layer 105; 106b denotes each of second insulating films formed between adjacent ones of the in-cell interconnection layers 105; 106c denotes a third insulating film formed on the uppermost in-cell interconnection layer 105; 107a denotes a contact hole for connecting the semiconductor substrate 102 to the lowermost in-cell interconnection layer 105; and 107b denotes each of through-holes for connecting adjacent ones of the in-cell interconnection layers 105 formed in different layers to each other.

In such a prior art semiconductor device 101, the between-cell interconnection layer 104 is formed on the third insulating film 106c in a region different from a region in which the function cell 103 is formed.

Although in the above description, the interconnection layer formed in a region different from the region in which the functional cell 103 is formed is composed of the between-cell interconnection layer 104, such an interconnection layer is occasionally composed of an interconnection layer to be connected to an I/O cell, a power supply interconnection layer or a ground interconnection layer. Further, although in the above description, the between-cell interconnection layer 104 is formed on the third insulating film 106c, such a between-cell interconnection layer 104 is occasionally formed on another layer.

FIG. 8 is a plan view schematically showing a configuration of a semiconductor device according to a second prior art example. FIG. 9 is a sectional view taken on line IX—IX in FIG. 8. In FIGS. 8 and 9, reference numeral 111 denotes a semiconductor device; 113 denotes a functional cell, formed on a semiconductor substrate 102, in which a DRAM, an analog circuit and the like are formed; and 114 denotes a between-cell interconnection layer for connecting the functional cell 113 to another functional cell 113 (not shown).

In the functional cell 113, reference numeral 116c denotes a third insulating film formed between the uppermost one of in-cell interconnection layers 105 and a between-cell interconnection layer 114; and 116d denotes a fourth insulating film formed on the between-cell interconnection layer 114.

Other components are the same as or similar to those indicated by the same reference numerals in FIGS. 6 and 7.

In such a prior art semiconductor device 111, the between-cell interconnection layer 114 is previously formed on the third insulating film 116c in the functional cell 113.

Although in the above description, the interconnection layer previously formed in the functional cell 113 is composed of the between-cell interconnection layer 114, such an interconnection layer is occasionally composed of an interconnection layer to be connected to an I/O cell, a power supply interconnection layer or a ground interconnection layer. Further, although in the above description, the between-cell interconnection layer 114 is formed on the third insulating film 116c, such a between-cell interconnection layer 114 is occasionally formed on another layer.

Techniques related to the present invention have been disclosed in JP-A-60/224244, JP-A 3/263355, JP-A4/69950, JP-A-63/244877, and JP-A-1/164048; however, either of the techniques fails to disclose features of the present invention which will be described later.

As described above, in the semiconductor device in the first prior art example, since the between-cell interconnection layer 104 or the like is formed in a region different from a region in which the functional cell 103 is formed, there occurs a problem that the between-cell interconnection layer 104 or the like is made longer to thereby cause a delay of an operational speed.

In the semiconductor device in the second prior art example, since the between-cell interconnection layer 114 is previously formed in the functional cell 113, there occurs a problem that the between-cell interconnection layer 114 or the like cannot be occasionally formed depending on an interconnection structure of the in-cell interconnection layers 105 provided in the functional cell 113.

SUMMARY OF THE INVENTION

The present invention has been made to solve the above-described problems, and an object of the present invention is to provide a semiconductor device in which a delay of an operational speed is relaxed and a method of fabricating the semiconductor device.

According to a first aspect of the present invention, there is provided a semiconductor device including a functional cell formed on a semiconductor substrate, and a shield interconnection layer which is formed on the upper side from the uppermost one of in-cell interconnection layers provided in the functional cell in such a manner as to cover the functional cell and which is connected to an interconnection layer having a specific potential.

In accordance with the first aspect, the semiconductor device includes a functional cell formed on a semiconductor substrate, and a shield interconnection layer which is formed on the upper side from the uppermost one of in-cell interconnection layers provided in the functional cell in such a manner as to cover the functional cell and which is connected to an interconnection layer having a specific potential, and accordingly, a between-cell interconnection layer or the like can be formed on the upper side from the shield interconnection layer formed in a region in which the function cell is formed. As a result, there can be obtained an effect of shortening the between-cell interconnection or the like, thereby relaxing a delay of an operational speed.

According to a second aspect of the present invention, the shield interconnection layer is formed in such a manner as to cover the entire surface of a region in which the functional cell is formed.

In accordance with the second aspect, since the shield interconnection layer is formed in such a manner as to cover the entire surface of the region in which the functional cell is formed, there can be obtained an effect of allowing a between-cell interconnection or the like to be formed on the upper side from the shield interconnection layer irrespective of an interconnection structure of the in-cell interconnection layers provided in the functional cell. Further, there can be obtained an effect of improving the flatness of an interconnection layer or an insulating film formed on the upper side from the shield interconnection layer.

According to a third aspect of the present invention, the shield interconnection layer is formed in such a manner as to cover the entire surface of a portion, of a region where the functional cell is formed, in which an in-cell interconnection layer for transmitting a sensitive signal is formed.

In accordance with the third aspect, since the shield interconnection layer is formed in such a manner as to cover the entire surface of a portion, of the region where the functional cell is formed, in which an in-cell interconnection layer for transmitting a sensitive signal is formed, there can be obtained an effect of allowing a between-cell interconnection layer or the like to be formed in an arbitrary layer depending on design of the semiconductor device in a region different from the region in which the in-cell interconnection layer for transmitting a sensitive signal is formed.

According to a fourth aspect of the present invention, the shield interconnection layer is connected to an interconnection layer having a specific potential in a region different from a region in which the functional cell is formed.

In accordance with the fourth aspect, since the shield interconnection layer is connected to an interconnection layer having a specific potential in a region different from the region in which the functional cell is formed, there can be obtained an effect of allowing the shield interconnection layer to be connected to an interconnection layer having a specific potential irrespective of an interconnection structure of in-cell interconnection layers provided in the functional cell.

According to a fifth aspect of the present invention, the functional cell contains a memory formed therein.

In accordance with the fifth aspect, since the functional cell contains a memory formed therein, there can be obtained an effect of making smaller an area of the semiconductor device by forming a between-cell interconnection layer or the like on the upper side from the shield interconnection layer formed in a region in which the functional cell is formed.

According to a sixth aspect of the present invention, there is provided a method of fabricating a semiconductor device, including the steps of: forming a functional cell on a semiconductor substrate; forming a shield interconnection layer on the upper side from the uppermost interconnection layer constituting the functional cell in such a manner as to cover the functional cell; and connecting the shield interconnection layer to an interconnection layer having a specific potential.

In accordance with the sixth aspect, the semiconductor device is fabricated by the steps of forming a functional cell on a semiconductor substrate, forming a shield interconnection layer on the upper side from the uppermost interconnection layer constituting the functional cell in such a manner as to cover the functional cell, and connecting the shield interconnection layer to an interconnection layer having a specific potential, and accordingly, there can be obtained an effect capable of fabricating the semiconductor device in which a delay of an operational speed is relaxed.

DETAILED DESCRIPTION OF THE PREFERRED EMBODIMENTS

Hereinafter, embodiments of the present invention will be described.

Embodiment 1

Figure 1:
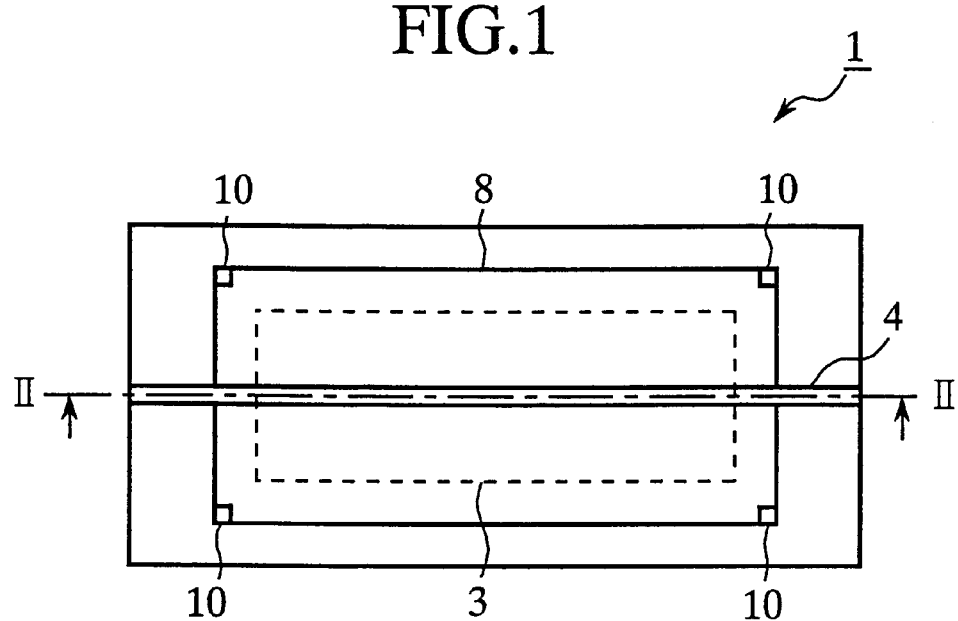
FIG. 1 is a plan view showing a configuration of a semiconductor device according to a first embodiment of the present invention.
Figure 2:
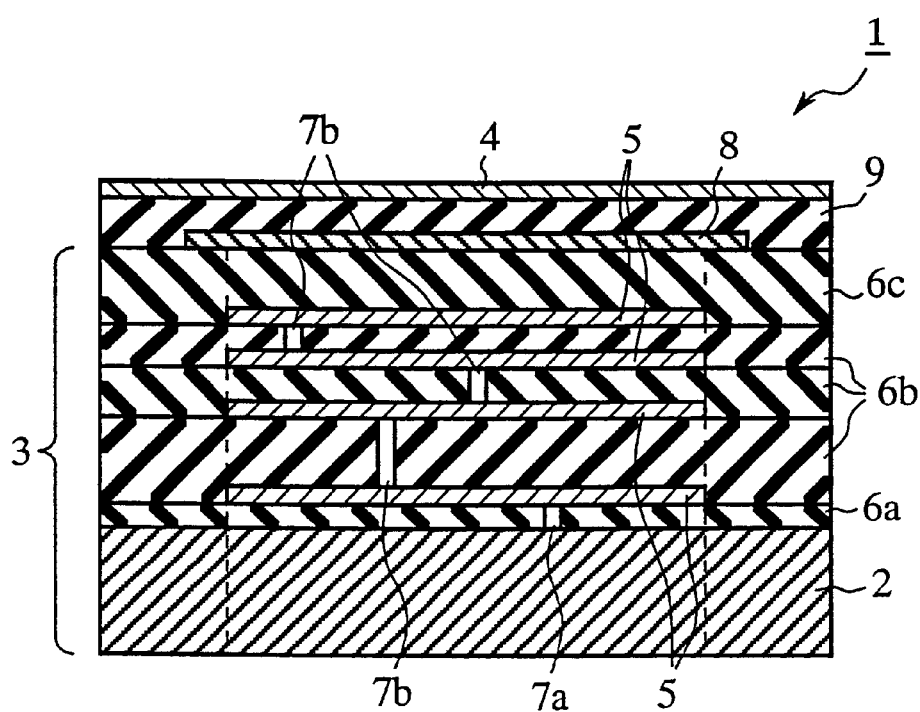
FIG. 2 is a sectional view taken on line II—II in FIG. 1.

FIG. 1 is a plan view showing a configuration of a semiconductor device according to a first embodiment of the present invention. FIG. 2 is a sectional view taken on line II—II in FIG. 1. In FIGS. 1 and 2, reference numeral 1 denotes a semiconductor device; 2 denotes a semiconductor substrate; 3 denotes a functional cell, formed on the semiconductor substrate 2, in which a DRAM (memory), an analog circuit, and the like are formed; and 4 denotes a between-cell interconnection layer for connecting the functional cell 3 to another functional cell 3 (not shown).

In the functional cell 3, reference numeral 5 denotes each of in-cell interconnection layers provided in the functional cell 3; 6a denotes a first insulating film formed between the semiconductor substrate 2 and the lowermost in-cell interconnection layer 5; 6b denotes each of second insulating films formed between adjacent ones of the in-cell interconnection layers 5; 6c denotes a third insulating film formed on the uppermost in-cell interconnection layer 5; 7a denotes a contact hole for connecting the semiconductor substrate 2 to the lowermost in-cell interconnection layer 5; and 7b denotes each of first through-holes for connecting adjacent ones of the in-cell interconnection layers 5 formed in different layers to each other.

Reference numeral 8 denotes a shield interconnection layer which is formed on the upper side from the uppermost in-cell interconnection layer 5 provided in the functional cell 3 in such a manner as to cover the functional cell 3 and which is connected to an interconnection layer having a specific potential; 9 denotes a fourth insulating film formed between the shield interconnection layer 8 and the between-cell interconnection layer 4; and 10 denotes a second through-hole for connecting the shield interconnection layer 8 to an interconnection layer having a specific potential such as a power supply interconnection layer or a ground interconnection layer.

In such a semiconductor device 1 according to the first embodiment, the shield interconnection layer 8 is formed on the third insulating layer 6c in such a manner as to cover the entire surface of a region in which the functional cell 3 is formed. And, the shield interconnection layer 8 is connected to an interconnection layer having a specific potential such as the power supply interconnection layer or the ground interconnection layer in a region different from the region in which the functional cell 3 is formed. An interconnection layer having a specific potential such as the power supply interconnection layer or the ground interconnection layer is formed in an arbitrary layer depending on design of the semiconductor device.

Further, in the semiconductor device 1 according to the first embodiment, the between-cell interconnection layer 4 is formed on the fourth insulating layer 9 in such a manner as to cross the region in which the functional cell 3 is formed.

Although the interconnection layer crossing the region in which the functional cell 3 is formed is represented by the between-cell interconnection layer 4 in the first embodiment, such an interconnection layer may be composed of an interconnection layer to be connected to an I/O cell, the power supply interconnection layer, or the ground interconnection layer.

Figure 3A:
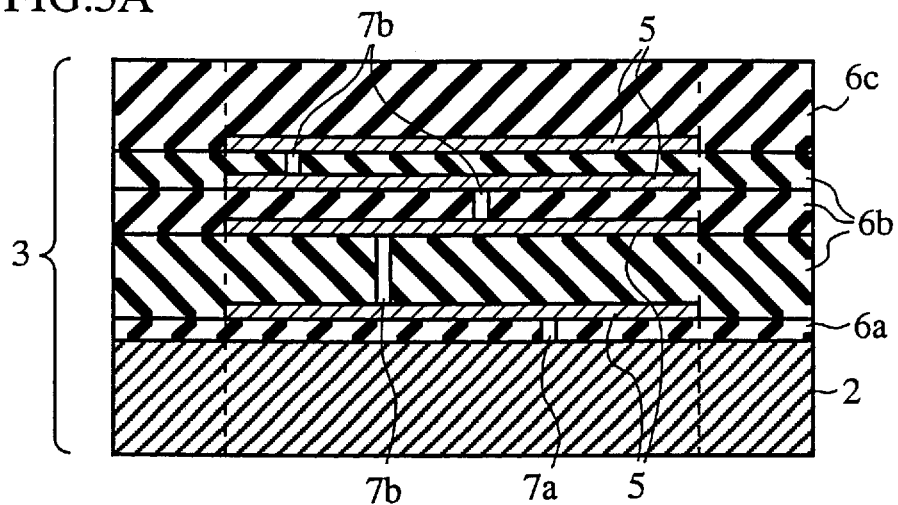
FIGS. 3A to 3C are sectional views showing steps of fabricating the semiconductor device according to the first embodiment of the present invention.
Figure 3B:
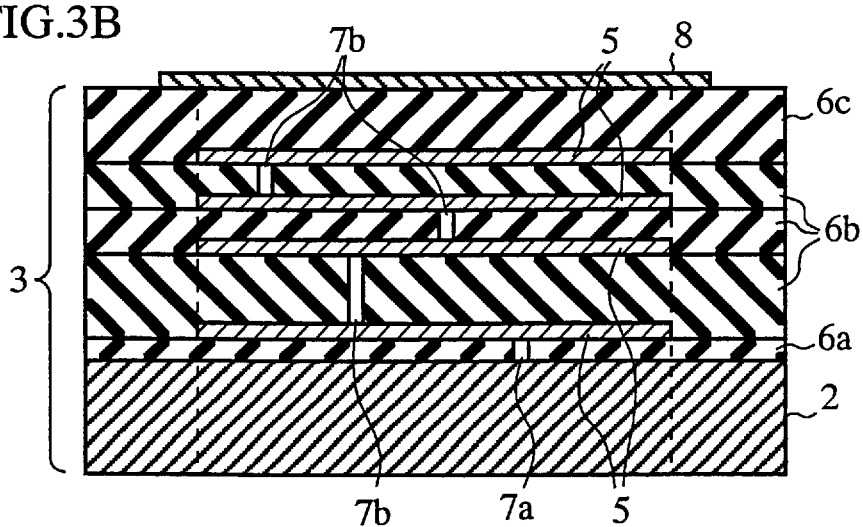
Figure 3C:
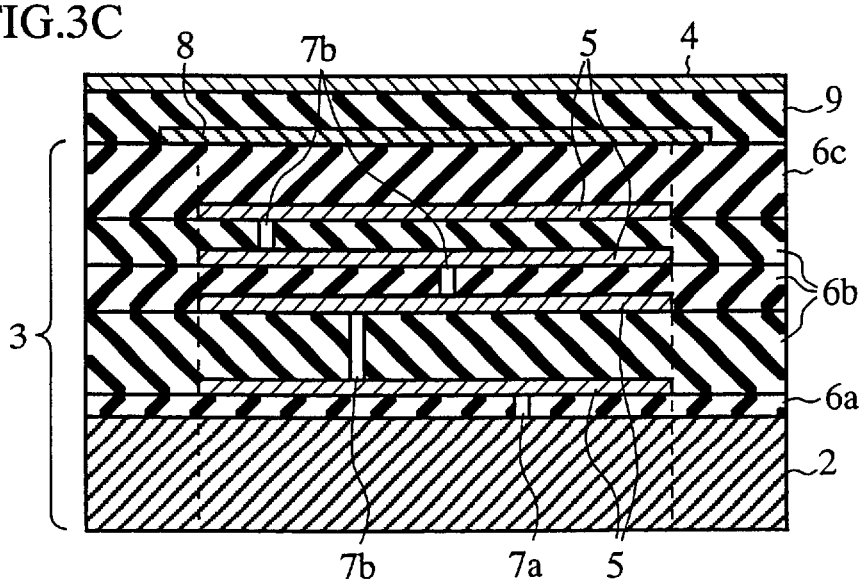

Next, a method of fabricating the semiconductor device according to the first embodiment of the present invention will be described. FIGS. 3A to 3C are sectional views showing sequential steps of fabricating the semiconductor device according to the first embodiment of the present invention.

In fabrication of the semiconductor device 1, first, a functional cell 3 is formed on a semiconductor substrate 2 (see FIG. 3A). In this embodiment, after a transistor or the like provided in the functional cell 3 is formed in the semiconductor substrate 2, a first insulating film 6a is formed on the semiconductor substrate 2; in-cell interconnection layers 5 and second insulating films 6b are alternately formed on the first insulating film 6a; and a third insulating film 6c is formed on the uppermost in-cell insulating layer 5. Further, a contact hole 7a for connecting the semiconductor substrate 2 to the lowermost in-cell interconnection layer 5 is formed in the first insulating film 6a, and first through-holes 7b for connecting adjacent ones of the interconnection layers 5 formed in different layers to each other are formed in the second insulating films 6b.

Then, a shield interconnection layer 8 is formed on the upper side from the uppermost in-cell interconnection layer 5 provided in the functional cell 3 in such a manner as to cover the functional cell 3 (see FIG. 3B). In the first embodiment, the shield interconnection layer 8 is formed on the third insulating film 6c in such a manner as to cover the entire surface of a region in which the functional cell 3 is formed.

A between-cell interconnection layer 4 is then formed in such a manner as to cross the region in which the functional cell 3 is formed (see FIG. 3C). In the first embodiment, after a fourth insulating film 9 is formed on the shield interconnection layer 8, the between-cell interconnection layer 4 is formed on the fourth insulating film 9.

Further, in the first embodiment, to connect the shield interconnection layer 8 to an interconnection layer having a specific potential such as a power supply interconnection layer or a ground interconnection layer through a second through-hole 10, in the case where the shield interconnection layer 8 is connected to an underlying interconnection layer, a second through-hole 10 is formed before the step of forming the shield interconnection layer 8, while in the case where the shield interconnection layer 8 is connected to an overlying interconnection layer, the second through-hole 10 is formed after the step of forming the shield interconnection layer 8.

As described above,.according to the first embodiment, since the shield interconnection layer 8 is formed on the upper side from the uppermost in-cell interconnection layer 5 provided in the functional cell 3 in such a manner as to cover the entire surface of the region in which the functional cell 3 is formed and is connected to an interconnection layer having a specific potential, the in-cell interconnections 5 can be sufficiently shielded. Accordingly, the between-cell interconnection layer 4 or the like can be formed on the upper side from the shield interconnection layer 8 formed in the region in which the functional cell 3 is formed. As a result, there can be obtained an effect of shortening the between-cell interconnection layer 4 or the like, thereby relaxing a delay of an operational speed.

Also, according to the first embodiment, since the shield interconnection layer 8 is formed in such a manner as to cover the entire surface of the region in which the functional cell 3 is formed, there can be obtained an effect of allowing the between-cell interconnection layer 4 or the like to be formed on the upper side from the shield interconnection layer 4 irrespective of an interconnection structure of the in-cell interconnection layers 5 provided in the functional cell 3.

Further, according to the first embodiment, since the shield interconnection layer 8 is formed in such a manner as to cover the entire surface of the region in which the functional cell 3 is formed, there can be obtained an effect of enhancing the flatness of an interconnection layer or an insulating film formed on the upper side from the shield interconnection layer 8.

Also, according to the first embodiment, since the shield interconnection layer 8 is connected to an interconnection layer having a specific potential in a region different from the region in which the functional cell 3 is formed, there can be obtained an effect of allowing the shield interconnection layer 8 to be connected to an interconnection layer having a specific potential irrespective of an interconnection structure of the in-cell interconnection layers provided in the functional cell 3.

Additionally, according to the first embodiment, there can be obtained the following effect: namely, in the case of using the functional cell 3 in which a DRAM is formed, the area of the functional cell 3 is made larger; however, according to the first embodiment, the area of the semiconductor device 1 can be made smaller by forming the between-cell interconnection layer 4 or the like on the upper side from the shield interconnection layer 8 formed in the region in which the functional cell 3 is formed.

Embodiment 2

Figure 4:
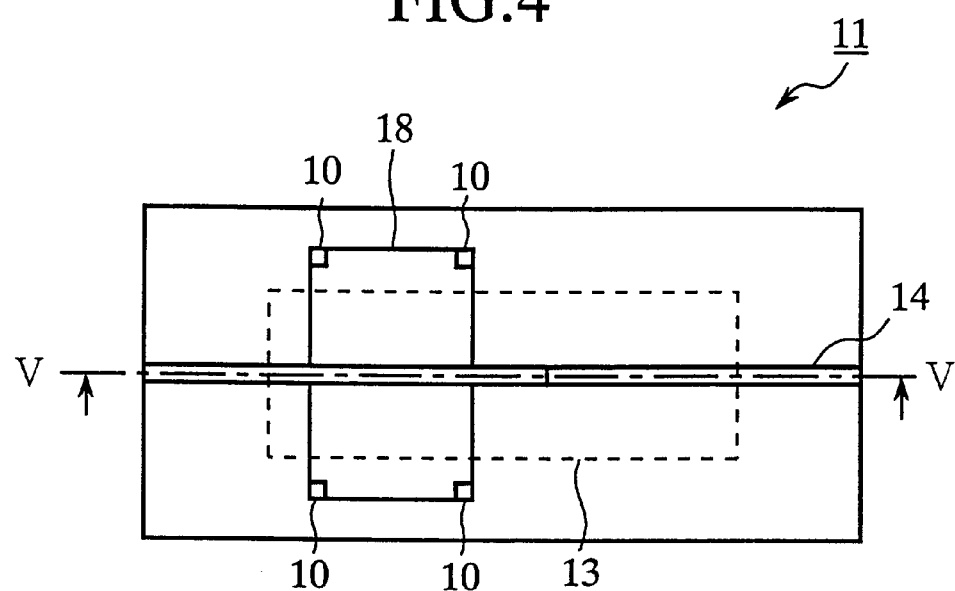
FIG. 4 is a plan view showing a configuration of a semiconductor device according to a second embodiment of the present invention.
Figure 5:
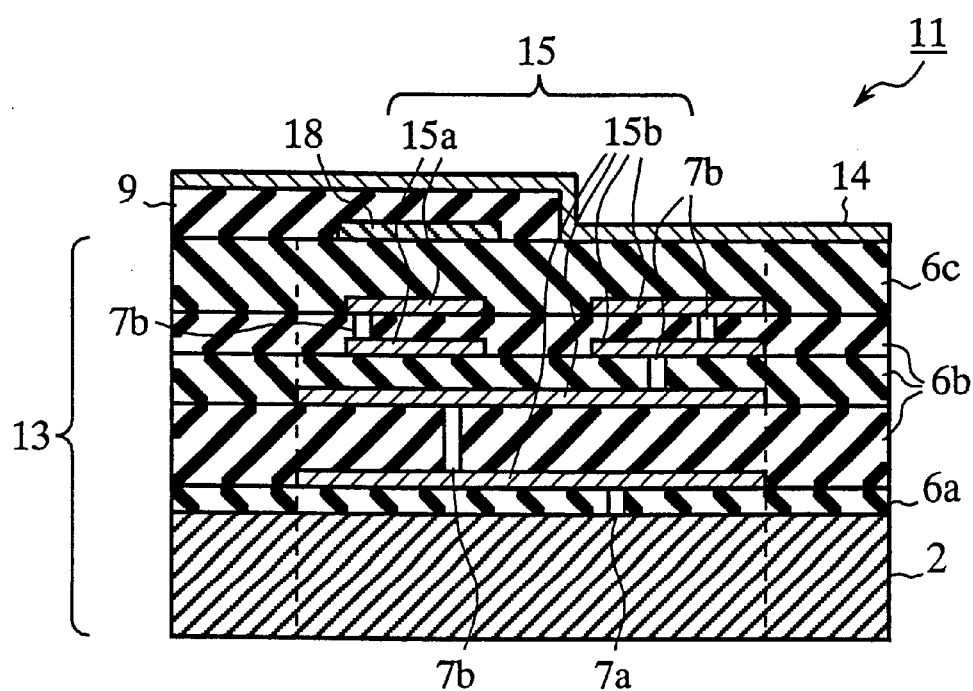
FIG. 5 is a sectional view taken on line V—V in FIG. 4.
Figure 6:
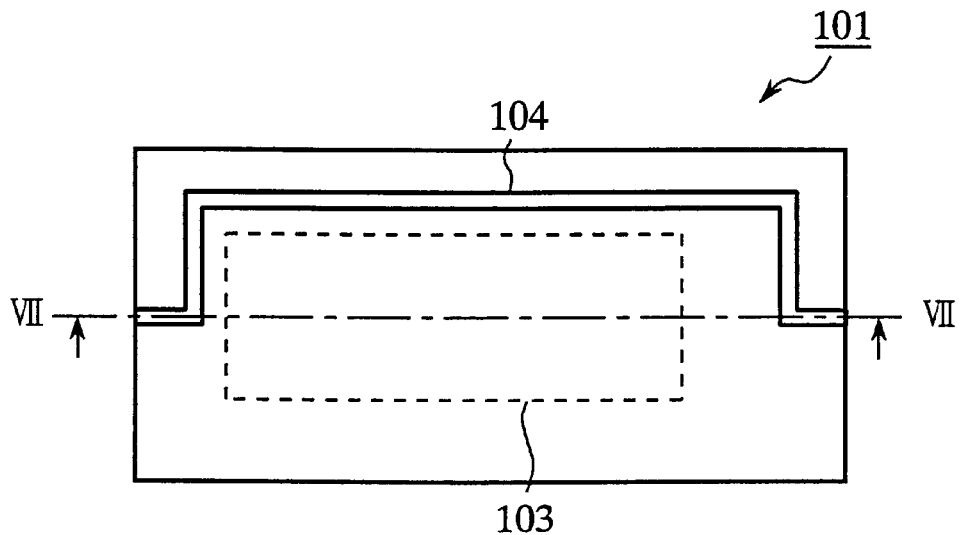
FIG. 6 is a plan view schematically showing a configuration of a semiconductor device according to a first prior art example.
Figure 7:
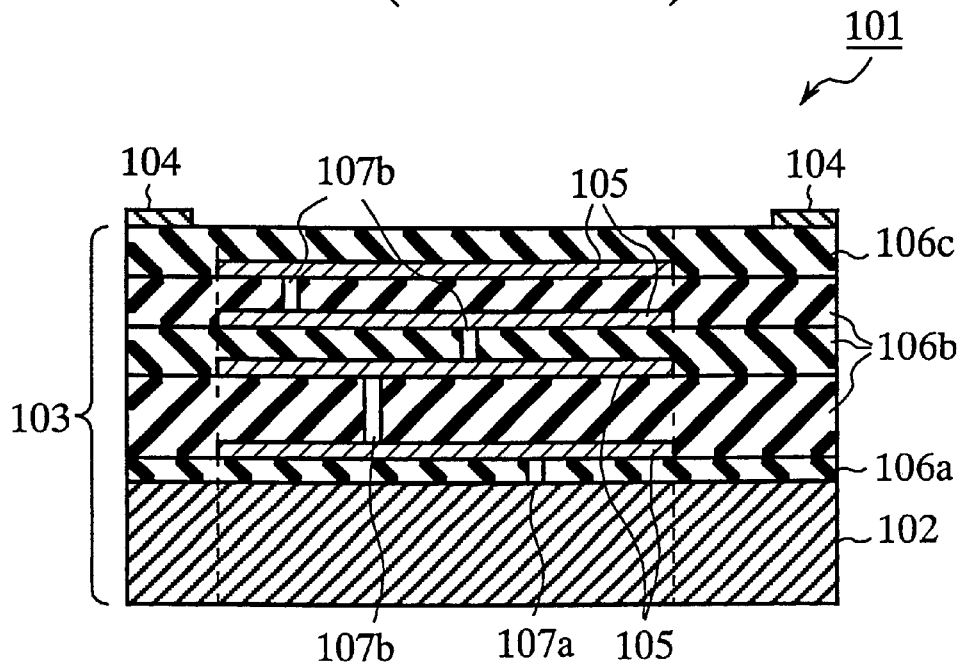
FIG. 7 is a sectional view taken on line VII—VII in FIG. 6.
Figure 8:
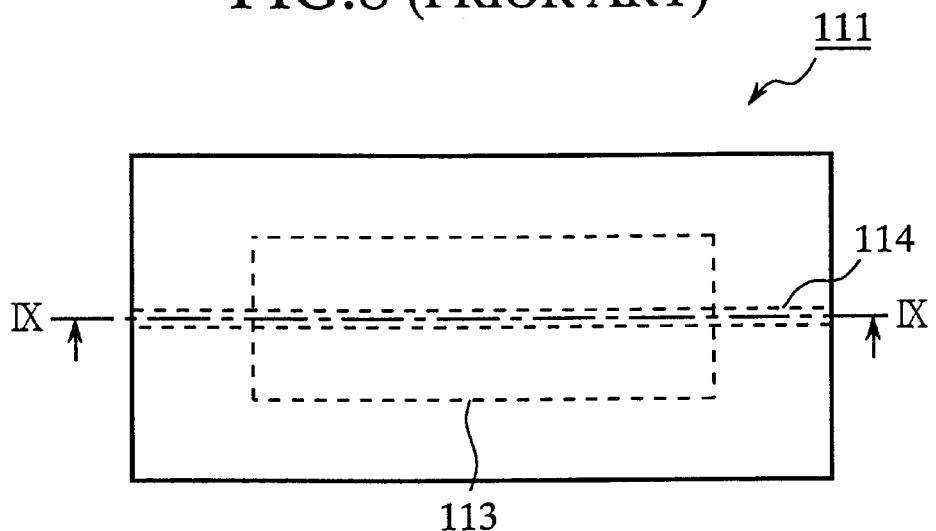
FIG. 8 is a plan view schematically showing a configuration of a semiconductor device according to a second prior art example.
Figure 9:
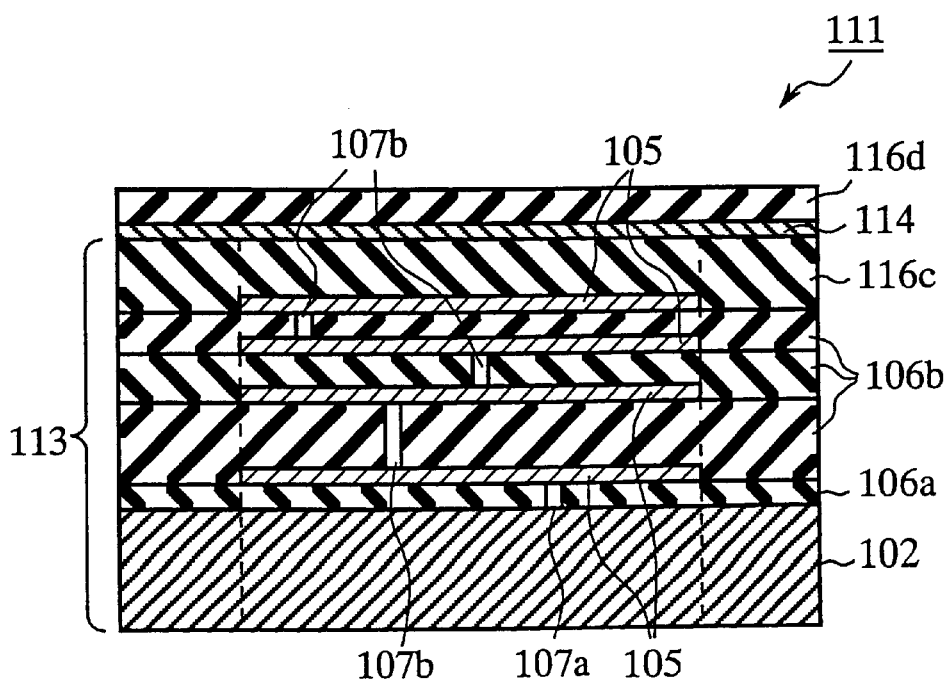
FIG. 9 is a sectional view taken on line IX—IX in FIG. 8.

FIG. 4 is a plan view showing a configuration of a semiconductor device according to a second embodiment of the present invention. FIG. 5 is a sectional view taken on line V—V in FIG. 4. In FIGS. 4 and 5, reference numeral 11 denotes a semiconductor device; 13 denotes a functional cell, formed on a semiconductor substrate 2, in which a DRAM (memory), an analog circuit and the like are formed; and 14 denotes a between-cell interconnection layer for connecting the functional cell 13 to another functional cell 13 (not shown).

In the functional cell 13, reference numeral 15 denotes in-cell interconnection layers provided in the functional cell 13, which are composed of in-cell interconnection layers 15a for transmitting sensitive signals, and in-cell interconnection layers 15b for transmitting signals other than the sensitive signals.

Reference numeral 18 denotes a shield interconnection layer which is formed on the upper side of the uppermost in-cell interconnection layer 15 provided in the functional cell 13 in such a manner as to cover the functional cell 13 and which is connected to an interconnection layer having a specific potential.

Other components are the same as or similar to those indicated by the same reference numerals in FIGS. 1 and 2.

A sensitive signal means a signal having a small amplitude of a potential and being liable to be affected by an environmental signal. For example, a readout signal in a DRAM may be taken as a sensitive signal. In this embodiment, a sensitive signal is defined as a signal in which an amplitude of a potential is smaller than the absolute value of a potential of a power supply.

In such a semiconductor device 11 according to the second embodiment, the shield interconnection layer 18 is formed on a third insulating film 6c in such a manner as to cover the entire surface of a portion, of the region where the functional cell 13 is formed, in which the incell interconnection layers 15a for transmitting sensitive signals are formed. And, the shield interconnection layer 18 is connected through a second through-hole 10 to an interconnection layer having a specific potential such as a power supply interconnection layer or a ground interconnection layer in a region different from the region in which the functional cell 13 is formed. An interconnection layer having a specific potential such as the power supply interconnection layer or the ground interconnection layer is formed in an arbitrary layer depending on design of the semiconductor device.

Further, in the semiconductor device 11 according to the second embodiment, the between-cell interconnection layer 14 is formed, in such a manner as to cross the region in which the functional cell 13 is formed, on a fourth insulating film 9 in the region in which the in-cell interconnection layers 15a for transmitting sensitive signals are formed and on the third insulating film 6c in a region different from the region in which the in-cell interconnection layers 15a for transmitting sensitive signals are formed.

Although the between-cell interconnection layer 14 is formed, in this embodiment, on the third insulating film 6c in a region different from the region in which the in-cell interconnection layers 15a for transmitting sensitive signals are formed, such a between-cell interconnection layer 14 may be formed in another layer. Further, although the interconnection layer crossing the region in which the functional cell 13 is formed is represented by the between-cell interconnection layer 14 in this embodiment, such an interconnection layer may be composed of an interconnection layer to be connected to an I/O cell, the power supply interconnection layer, or the ground interconnection layer.

A method of fabricating the semiconductor device according to the second embodiment is basically the same as that of the method of the semiconductor device according to the first embodiment.

As described above, according to the second embodiment, the shield interconnection layer 18 is formed on the upper side from the uppermost in-cell interconnection layer 15 provided in the functional cell 13 in such a manner as to cover the entire surface of a portion, of the region where the functional cell 13 is formed, in which the in-cell interconnection layers 15a for transmitting sensitive signals are formed, and is connected to an interconnection layer having a specific potential, so that the in-cell interconnection layers 15a for transmitting sensitive signals can be sufficiently shielded. Accordingly, the between-cell interconnection layer 14 or the like can be formed on the upper side from the shield interconnection layer 18 formed in the region in which the in-cell interconnection layers 15a for transmitting sensitive signals being liable to be affected by environmental signals is formed. As a result, there can be obtained an effect of shortening the between-cell interconnection layer 14 or the like, thereby relaxing a delay of an operational speed.

Also, according to the second embodiment, since the shield interconnection layer 18 is formed only in the region in which the in-cell interconnection layers 15a for transmitting sensitive signals are formed, there can be obtained an effect of allowing the between-cell interconnection layer 14 or the like to be formed in an arbitrary layer depending on design of the semiconductor device in a region different from the region in which the in-cell interconnection layers 15a for transmitting sensitive signals are formed.

Further, according to the second embodiment, since the shield interconnection layer 18 is formed in such a manner as to cover the entire surface of a portion, of the region where the functional cell 13 is formed, in which the in-cell interconnection layers 15a for transmitting sensitive signals are formed, there can be obtained an effect of allowing the between-cell interconnection layer 14 or the like to be formed on the upper side from the shield interconnection layer 18 irrespective of an interconnection structure of the in-cell interconnection layers 15 provided in the functional cell 13.

Also, according to the second embodiment, since the shield interconnection layer 18 is connected to an interconnection layer having a specific potential in a region different from the region in which the functional cell 13 is formed, there can be obtained an effect of allowing the shield interconnection layer 18 to be connected to an interconnection layer having a specific potential irrespective of an interconnection structure of the in-cell interconnection layers 15 provided in the functional cell 13.

Additionally, according to the second embodiment, there can be obtained the following effect: namely, in the case of using the functional cell 13 in which a DRAM is formed, the area of the functional cell 13 is made larger; however, according to the second embodiment, the area of the semiconductor device 11 can be made smaller by forming the between-cell interconnection layer 14 or the like on the upper side from the shield interconnection layer 18 formed in the region in which the functional cell 13 is formed.

Although in the above-described first and second embodiments, description is made by example of the case of forming one shield interconnection layer, the present invention is not limited thereto. The same effects as those in the first and second embodiments can be obtained even in the case of forming a plurality of shield interconnection layers. In particular, in the case where it is difficult to shield in-cell interconnection layers only by formation of one shield interconnection layer, it is effective to form a plurality of shield interconnection layers.

What is claimed is:

1. A semiconductor device comprising:
   a functional cell formed on a semiconductor substrate; and
   a shield interconnection layer formed on the upper side from the uppermost one of in-cell interconnection layers provided in said functional cell in such a manner as to cover said functional cell, said shield interconnection layer being connected to an interconnection layer having a specific potential, wherein said shield interconnection layer is formed only in a region in which an in-cell interconnection layer for transmitting a sensitive signal is formed.

2. A semiconductor device according to claim 1, wherein said shield interconnection layer is connected to an interconnection layer having a specific potential in a region different from a region in which said functional cell is formed.

3. A semiconductor device according to claim 1, wherein said functional cell contains a memory formed therein.

4. A method of fabricating a semiconductor device, comprising the steps of:

forming a functional cell on a semiconductor substrate;

forming a shield interconnection layer on the upper side from the uppermost one of in-cell interconnection layers provided in said functional cell in such a manner as to cover said functional cell, wherein said shield interconnection layer is formed only in a region in which an in-cell interconnection layer for transmitting a sensitive signal is formed; and connecting said shield interconnection layer to an interconnection layer having a specific potential.

5. A semiconductor device having a region provided on a semiconductor substrate and in which a functional cell, including a plurality of in-cell interconnection layers is formed, said device further comprising:

a shield interconnection layer which is positioned on the farther upper side from the uppermost layer of said plurality of in-cell interconnection layers, and which is constituted to cover said region in which said functional cell is formed, wherein said shield interconnection layer is formed only in a region in which an in-cell interconnection layer for transmitting a sensitive signal is formed, in said region in which said functional cell is formed.

6. The semiconductor device according to claim 5, wherein said shield interconnection layer is connected to an interconnection layer having a specific potential in another region other than said region in which said functional cell is formed.

7. The semiconductor device according to claim 5, wherein said functional cell is formed with a memory.

* * * * *